(12) United States Patent
Wang et al.

(10) Patent No.: US 10,581,183 B2
(45) Date of Patent: Mar. 3, 2020

(54) HIGH SPEED BOARD TO BOARD CONNECTION DEVICE

(71) Applicant: Molex, LLC, Lisle, IL (US)

(72) Inventors: Hujiao Wang, Pudong (CN); Thomas G. Premo, Downers Grove, IL (US); Harold Keith Lang, Cary, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/164,253

(22) Filed: Oct. 18, 2018

(65) Prior Publication Data

US 2019/0148852 A1  May 16, 2019

(30) Foreign Application Priority Data

Oct. 19, 2017 (CN) .......................... 2017 1 0996757

(51) Int. Cl.
*H05K 1/14* (2006.01)
*H05K 1/18* (2006.01)
(Continued)

(52) U.S. Cl.
CPC ............. *H01R 12/52* (2013.01); *H01R 12/62* (2013.01); *H01R 12/7023* (2013.01);
(Continued)

(58) Field of Classification Search
CPC ...... H01R 23/725; H01R 9/096; H01R 12/79; H01R 12/62; H01R 12/52; H01R 12/7023; H01R 12/7082; H01R 12/716; H01R 13/6315; H01R 13/502; H05K 1/144; H05K 1/189; H05K 2201/10189; H05K 2201/042
(Continued)

(56) References Cited

U.S. PATENT DOCUMENTS 5,161,981 A * 11/1992 Deak ...................... H01R 12/62
439/491
5,163,836 A * 11/1992 Young .................... H01R 12/79
439/67

(Continued)

FOREIGN PATENT DOCUMENTS

CN            201417834 Y       3/2010
CN            202585902 U       12/2012
(Continued)

*Primary Examiner* — Gary F Paumen
(74) *Attorney, Agent, or Firm* — Molex, LLC

(57) ABSTRACT

The present disclosure provides an electrical connection module and a board-to-board electrical connection device. The board-to-board electrical connection device comprises an upper circuit board, a first complementary connector provided to the upper circuit board, a lower circuit board; and an electrical connection module. The electrical connection module electrically connects the upper circuit board and the lower circuit board, and comprises an upper plate, a first connector provided to the upper plate to be mated with the first complementary connector, a lower plate, a plurality of supporting guide assemblies, a plurality of elastic members, an electrical connecting unit and a flexible circuit board. The plurality of supporting guide assemblies connects the upper plate and the lower plate and allows the upper plate to relative to the lower plate.

25 Claims, 12 Drawing Sheets

(51) Int. Cl.
  *H01R 12/52* (2011.01)
  *H01R 12/62* (2011.01)
  *H01R 12/70* (2011.01)
  *H01R 12/71* (2011.01)
  *H01R 12/79* (2011.01)
  *H01R 13/502* (2006.01)

(52) U.S. Cl.
  CPC ....... *H01R 12/7082* (2013.01); *H01R 12/716* (2013.01); *H01R 12/79* (2013.01); *H01R 13/502* (2013.01); *H05K 1/144* (2013.01); *H05K 1/189* (2013.01); *H05K 2201/042* (2013.01); *H05K 2201/10189* (2013.01)

(58) Field of Classification Search
  USPC .............................. 439/74, 493, 67, 247, 248
  See application file for complete search history.

(56) References Cited

U.S. PATENT DOCUMENTS

| | | | | |
|---|---|---|---|---|
| 5,917,149 A | * | 6/1999 | Barcley | H05K 1/0281 174/36 |
| 6,342,932 B1 | * | 1/2002 | Terao | G02F 1/13452 349/150 |
| 6,520,789 B2 | * | 2/2003 | Daugherty, Jr. | H01R 9/096 439/329 |
| 6,869,291 B2 | * | 3/2005 | Norland | H01R 12/62 439/67 |
| 7,014,475 B1 | * | 3/2006 | Mongold | H01R 12/721 439/67 |
| 7,503,769 B2 | * | 3/2009 | Ohtsuki | H01R 9/096 439/354 |
| 7,837,481 B1 | | 11/2010 | Mahoney et al. | |
| 8,251,712 B2 | * | 8/2012 | Cheng | H01R 12/7082 439/329 |
| 9,955,596 B2 | * | 4/2018 | Voss | H05K 5/0069 |
| 2004/0053519 A1 | * | 3/2004 | Li | H01R 12/714 439/63 |
| 2006/0073723 A1 | | 4/2006 | Cowgill et al. | |
| 2010/0055936 A1 | | 3/2010 | Chen et al. | |
| 2017/0237190 A1 | * | 8/2017 | Liao | H01R 12/7005 439/64 |

FOREIGN PATENT DOCUMENTS

| | | |
|---|---|---|
| CN | 204289986 U | 4/2015 |
| TW | 486170 U | 5/2002 |

\* cited by examiner

HIGH SPEED BOARD TO BOARD CONNECTION DEVICE

RELATED APPLICATIONS

This application claims priority to Chinese Application No. 201710996757.4, filed Oct. 19, 2017, which is incorporated herein by reference in its entirety.

TECHNICAL FIELD

The present disclosure relates to an electrical connection module, especially to an electrical connection module and a board-to-board electrical connection device for connecting two circuit boards.

BACKGROUND ART

In an existing electrical connection system for connecting a flexible circuit board and a circuit board, for example as disclosed in U.S. Pat. No. 7,014,475, in which two ends of the flexible circuit board are respectively connected to two surfaces of a circuit board, an electrical connector is provided in the middle of the flexible circuit board. Also an connection system, for example disclosed in U.S. Pat. No. 6,520,789, is a technology using the flexible circuit board to connect two circuit boards, which directly electrically connect a circuit of the flexible circuit board with circuits of upper and lower circuit boards by the clamping pressure without a connector, such a method using structural bumps for clamping to establish an electrical connection between the circuit boards is not only prone to a poor contact, but also unsuitable for high-rate multi-signal transmission.

Furthermore, the board-to-board electrical connection between two circuit boards generally employs two connectors, but when the spacing between the two circuit boards is too large, the terminals of the two mated connectors need to be long, so the impedance of the terminal would increase, and the contact normal three between the long terminals would reduce, which is not beneficial to high-rate signal transmission.

Another common board-to-board connection is to use an intermediate adapter connector to mate with the connectors on the two circuit boards, but such a configuration also increases the impedance among the three sets of terminals, which is not beneficial to high-rate signal transmission.

Moreover, for the mating between the above-mentioned connectors, if the position between the two circuit boards generates a larger deviation, the connectors cannot be complementary.

SUMMARY

Therefore, an object of the present disclosure is to provide an electrical connection module which may compensate for position deviation of two circuit boards and absorb external force.

Accordingly, in some embodiments, an electrical connection module in the present disclosure comprises an upper plate, a first connector, a lower plate, a plurality of supporting guide assemblies, a plurality of elastic members, an electrical connecting unit and a flexible circuit board. The first connector is provided to the upper plate. The lower plate is spaced apart from the upper plate and positioned below the upper plate. The plurality of supporting guide assemblies connects the upper plate and the lower plate and allow that the upper plate can move relative to the lower plate in a plane direction of the plate surface thereof and an up-down direction. The plurality of elastic members is respectively provided between the upper plate and the lower plate to provide elastic supporting forces for the upper plate. The electrical connecting unit is provided to the lower plate. The flexible circuit board has an upper connecting portion electrically connected to the first connector and a lower connecting portion electrically connected to the electrical connecting unit.

In some embodiments, the upper plate has a plurality of guiding holes penetrating in the up-down direction, the plurality of the guiding holes respectively allows the plurality of the supporting guide assemblies to pass through, and a hole diameter of each guiding hole is larger than an outer diameter of the corresponding supporting guide assembly.

In some embodiments, each supporting guide assembly comprises a supporting column and an upper limiting member, a lower end of the supporting column is fixed to the lower plate, the supporting column passes through the corresponding guiding hole and the outer diameter of the supporting column is smaller than the hole diameter of the guiding hole, the upper limiting member is positioned at an upper end of the supporting column and above the upper plate, an outer diameter of the upper limiting member is larger than the hole diameter of the corresponding guiding hole to limit an uppermost position of the upper plate where the upper plate moves upwardly, the plurality of the elastic members are respectively sheathed on the plurality of the supporting columns.

In some embodiments, the electrical connection module further comprises a plurality of upper stopping blocks, the plurality of the upper stopping blocks is provided to the upper plate to limit an mating depth between the first connector and a complementary connector.

In some embodiments, each supporting guide assembly further comprises a lock member to connect the supporting column and the upper limiting member.

In some embodiments, an upper surface of the upper plate is provided with a conductive trace, the first connector and the upper connecting portion of the flexible circuit board are mechanically and electrically connected with the conductive trace, the first connector and the flexible circuit board are electrically connected via the conductive trace.

In some embodiments, the upper connecting portion of the flexible circuit board is provided to an upper surface of the upper plate, the first connector is provided to the upper connecting portion and mechanically and electrically connected with the upper connecting portion.

In some embodiments, a lower surface of the lower plate is provided with a conductive trace, the electrical connecting unit consists of a plurality of soldering members, the plurality of the soldering members are mounted in the lower surface of the lower plate and electrically connected with the conductive trace of the lower plate, the lower connecting portion of the flexible circuit board is mechanically and electrically connected with the conductive trace of the lower plate, the electrical connecting unit and the flexible circuit board are electrically connected via the conductive trace of the lower plate.

In some embodiments, the lower connecting portion of the flexible circuit board is provided to a lower surface of the lower plate, the electrical connecting unit consists of the plurality of soldering members, the plurality of the soldering members are mounted in the lower connecting portion to be electrically connected with the flexible circuit board.

In some embodiments, the lower connecting portion of the flexible circuit board is provided to a lower surface of the lower plate, the electrical connection module further comprises a second connector, the second connector is provided to the lower connecting portion and mechanically and electrically connected with the lower connecting portion.

In some embodiments, a lower surface of the lower plate is provided with a conductive trace, the electrical connection module further comprises a second connector, the second connector and the lower connecting portion of the flexible circuit board are mechanically and electrically connected with the conductive trace of the lower plate, the second connector and the flexible circuit board are electrically connected via the conductive trace of the lower plate.

Another object of the present disclosure is to provide a board-to-board electrical connection device comprising the aforementioned electrical connection module.

Accordingly, in some embodiments, the board-to-board electrical connection device in the present disclosure comprises an upper circuit board, a first complementary connector provided to the upper circuit board, a lower circuit board; and an electrical connection module. The electrical connection module electrically connects the upper circuit board and the lower circuit board, and comprises an upper plate, a first connector, a lower plate, a plurality of supporting guide assemblies, a plurality of elastic members, an electrical connecting unit and a flexible circuit board. The first connector is provided to the upper plate to be mated with the first complementary connector. The lower plate is spaced apart from the upper plate and positioned below the upper plate. The plurality of supporting guide assemblies connect the upper plate and the lower plate and allow that the upper plate can move relative to the lower plate in a plane direction of a plate surface of the upper plate and the up-down direction. The plurality of elastic members are provided between the upper plate and the lower plate to provide elastic supporting forces for the upper plate. The electrical connecting unit is provided to the lower plate to be electrically connected with the lower circuit board. The flexible circuit board has an upper connecting portion electrically connected to the first connector and a lower connecting portion electrically connected to the electrical connecting unit.

In some embodiments, the upper plate has a plurality of guiding holes penetrating in the up-down direction, the plurality of the guiding holes respectively allow the plurality of the supporting guide assemblies to pass through, and a hole diameter of each guiding hole is larger than an outer diameter of the corresponding supporting guide assembly.

In some embodiments, each supporting guide assembly comprises a supporting column and an upper limiting member, a lower end of the supporting column is fixed to the lower plate, the supporting column passes through the corresponding guiding hole and the outer diameter of the supporting column is smaller than the hole diameter of the guiding hole, the upper limiting member is positioned at an upper end of the supporting column and above the upper plate, an outer diameter of the upper limiting member is larger than the hole diameter of the corresponding guiding hole to limit an uppermost position of the upper plate where the upper plate moves upwardly, the plurality of the elastic members are respectively sheathed on the plurality of the supporting columns.

In some embodiments, the electrical connection module further comprises a plurality of upper stopping blocks, the plurality of the upper stopping blocks are provided to the upper plate to limit an mating depth between the first connector and a complementary connector.

In some embodiments, each supporting guide assembly further comprises a lock member to connect the supporting column and the upper limiting member.

In some embodiments, the upper circuit board and the lower circuit hoard are respectively fixed, and the upper circuit board is fixed at a position such that the upper plate compresses the plurality of the elastic members and a gap is formed between the upper plate and the plurality of the upper limiting members.

In some embodiments, an upper surface of the upper plate is provided with a conductive trace, the first connector and the upper connecting portion of the flexible circuit board are mechanically and electrically connected with the conductive trace, the first connector and the flexible circuit board are electrically connected via the conductive trace.

in some embodiments, the upper connecting portion of the flexible circuit board is provided to an upper surface of the upper plate, the first connector is provided to the upper connecting portion and mechanically and electrically connected with the upper connecting portion.

In some embodiments, a lower surface of the lower plate is provided with a conductive trace, the electrical connecting unit consists of a plurality of soldering members, the plurality of the soldering members are mounted in the lower surface of the lower plate and electrically connected with the conductive trace of the lower plate, the lower connecting portion of the flexible circuit board is mechanically and electrically connected with the conductive trace of the lower plate, the electrical connecting unit and the flexible circuit board are electrically connected via the conductive trace of the lower plate.

In some embodiments, the lower connecting portion of the flexible circuit board is provided to a lower surface of the lower plate, the electrical connecting unit consists of the plurality of soldering members, the plurality of the soldering members are mounted in the lower connecting portion to be electrically connected with the flexible circuit board.

In sonic embodiments, the board-to-board electrical connection device further comprises a second complementary connector provided to the lower circuit board, the lower connecting portion of the flexible circuit board is provided to a lower surface of the lower plate, the electrical connection module further comprises a second connector to be mated with the second complementary connector, the second connector is provided to the lower connecting portion and mechanically and electrically connected with the lower connecting portion.

In sonic embodiments, the board-to-board electrical connection device further comprises a second complementary connector provided to the lower circuit board, a lower surface of the lower plate is provided with a conductive trace, the electrical connection module further comprises a second connector to be mated with the second complementary connector, the second connector and the lower connecting portion of the flexible circuit board are mechanically and electrically connected with the conductive trace of the lower plate, the second connector and the flexible circuit board are electrically connected via the conductive trace of the lower plate.

In some embodiments, the first connector has the same structure as the first complementary connector, and the second connector has the same structure as the second complementary connector.

In some embodiments, the first connector, the first complementary connector, the second connector and the second complementary connector are Mezzanine connectors.

In some embodiments, the flexible circuit board is provided with an electronic component for adapter signal processing.

In some embodiments, a sum of the elastic forces which the plurality of the elastic members are applied to the upper plate is larger than a mating force between the first connector and the first complementary connector.

The present disclosure at least has the following beneficial effects: the upper plate can move in the three-dimension direction and the plurality of elastic members elastically support the upper plate in the up-down direction, which can not only compensate the deviation of the relative position of the upper circuit board and the lower circuit board so that the first connector and the first complementary connector can be accurately aligned with and mated with each other, but also allow that the first connector and the first complementary connector are firmly mated with each other under the elastic forces that the plurality of elastic members are applied to the upper plate and also absorb the forces generated by the external environment, such as movement, vibration or improper external forces.

BRIEF DESCRIPTION OF THE DRAWINGS

The other features and effects of the present disclosure will be apparent in the detailed description in combination with the accompanying figures, and in which.

DETAILED DESCRIPTION OF THE PREFERRED EMBODIMENTS

Figure 1:
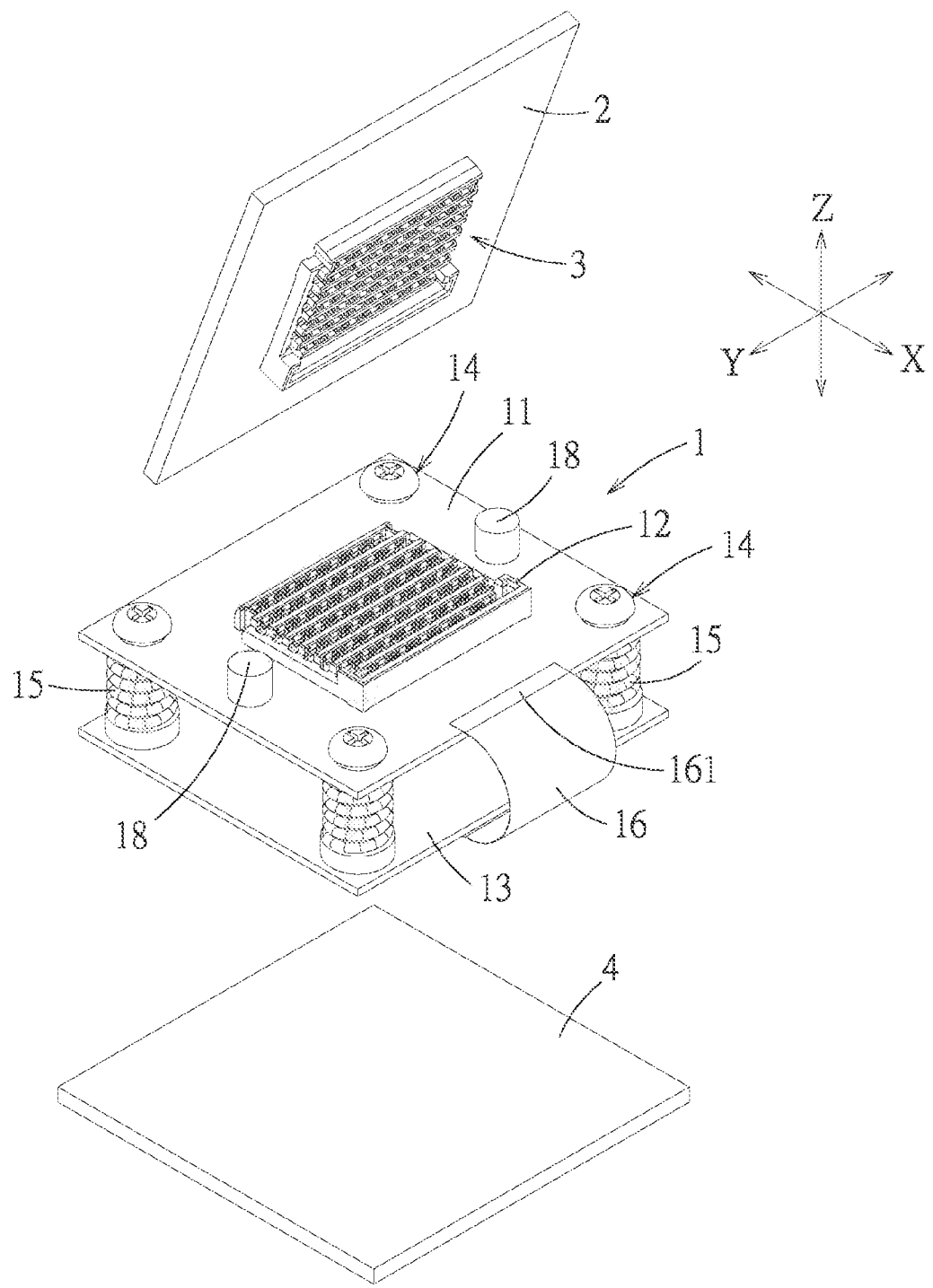
FIG. 1 is an exploded perspective view of a first embodiment of a board-to-board electrical connection device in the present disclosure.

Before the present disclosure is described in detail, it should be noted that similar element is indicated by the same reference numeral in the following description.

Figure 2:
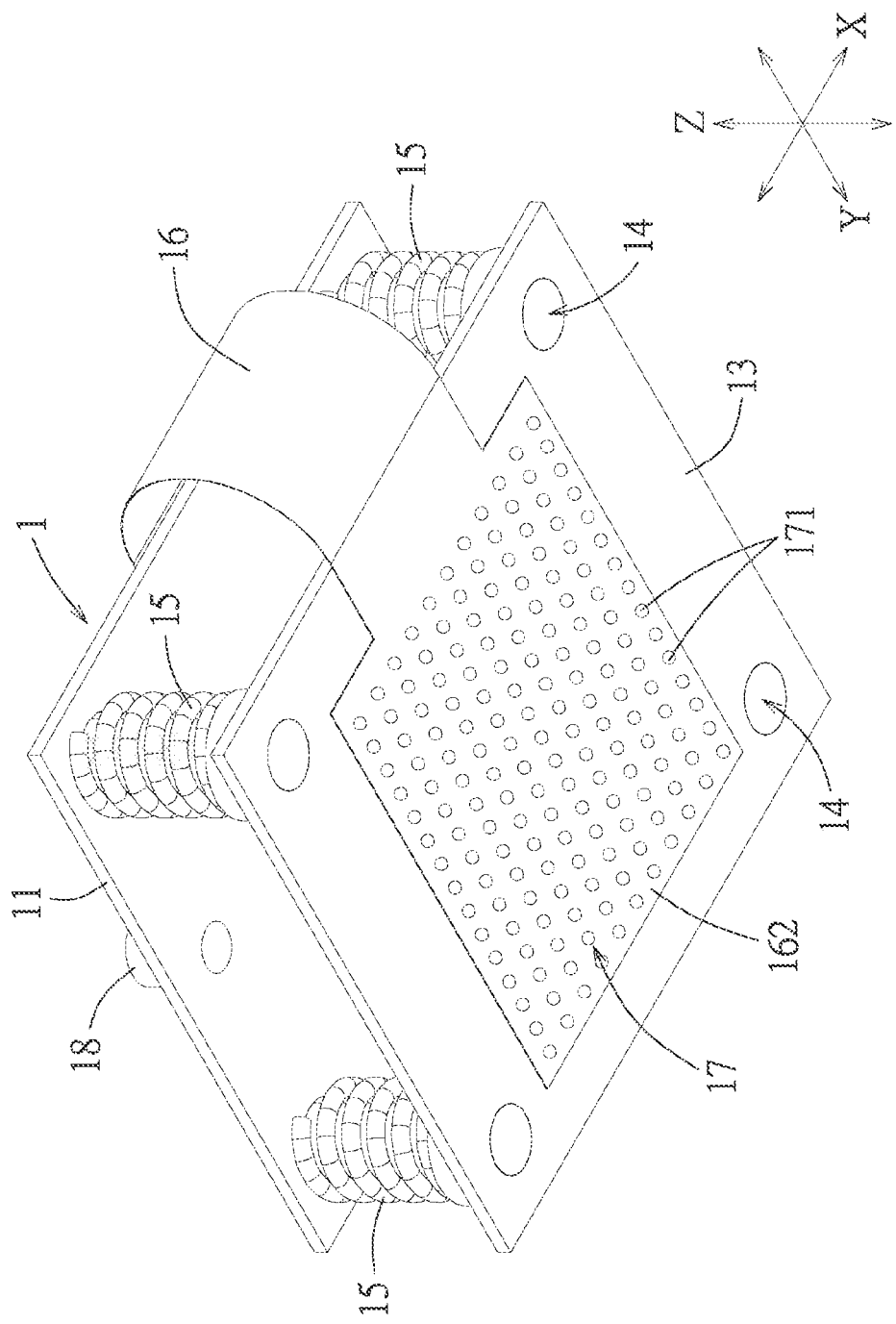
FIG. 2 is a perspective view of the electrical connection module of the first embodiment.
Figure 3:
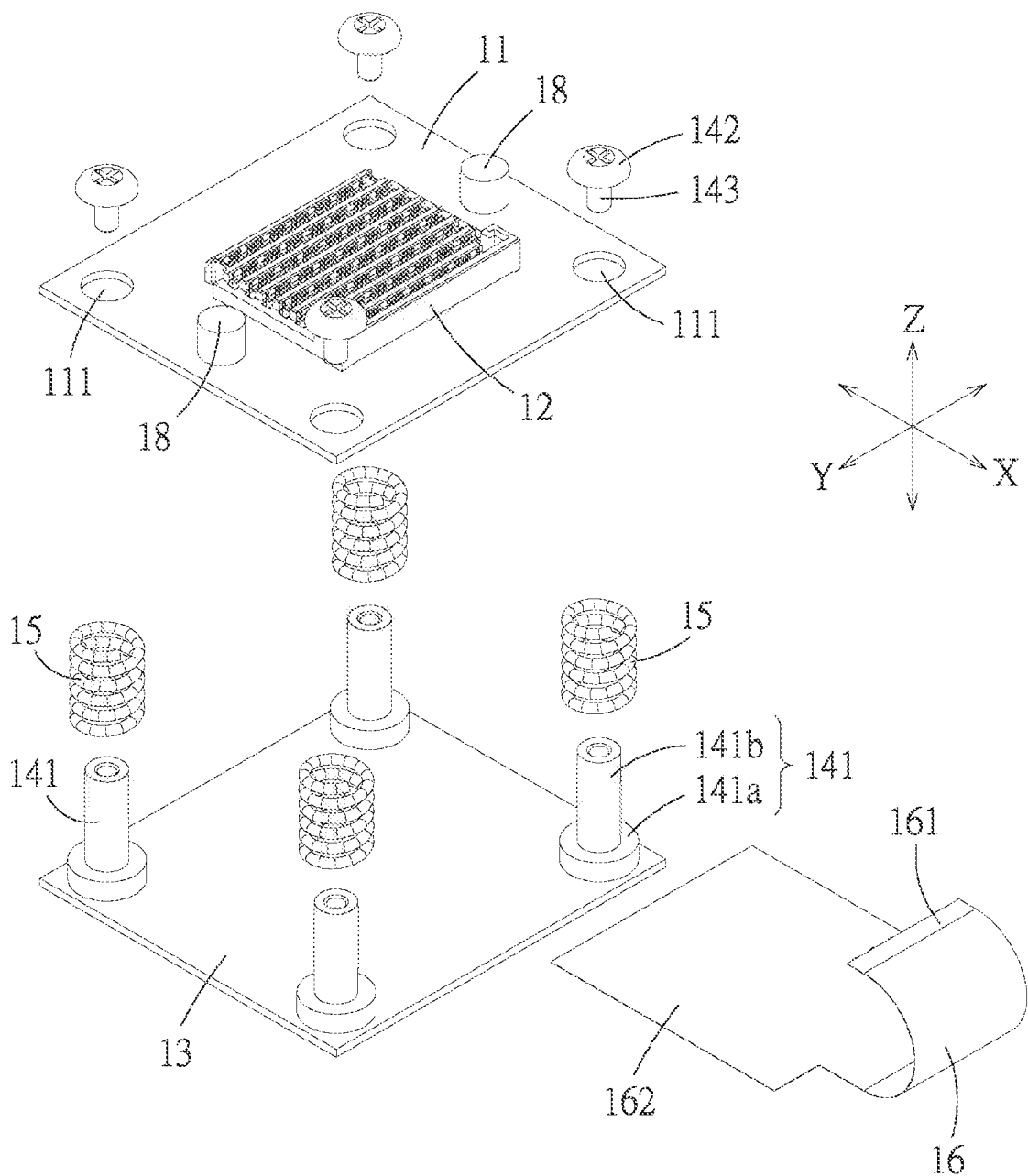
FIG. 3 is an exploded perspective view of the electrical connection module of the first embodiment.
Figure 4:
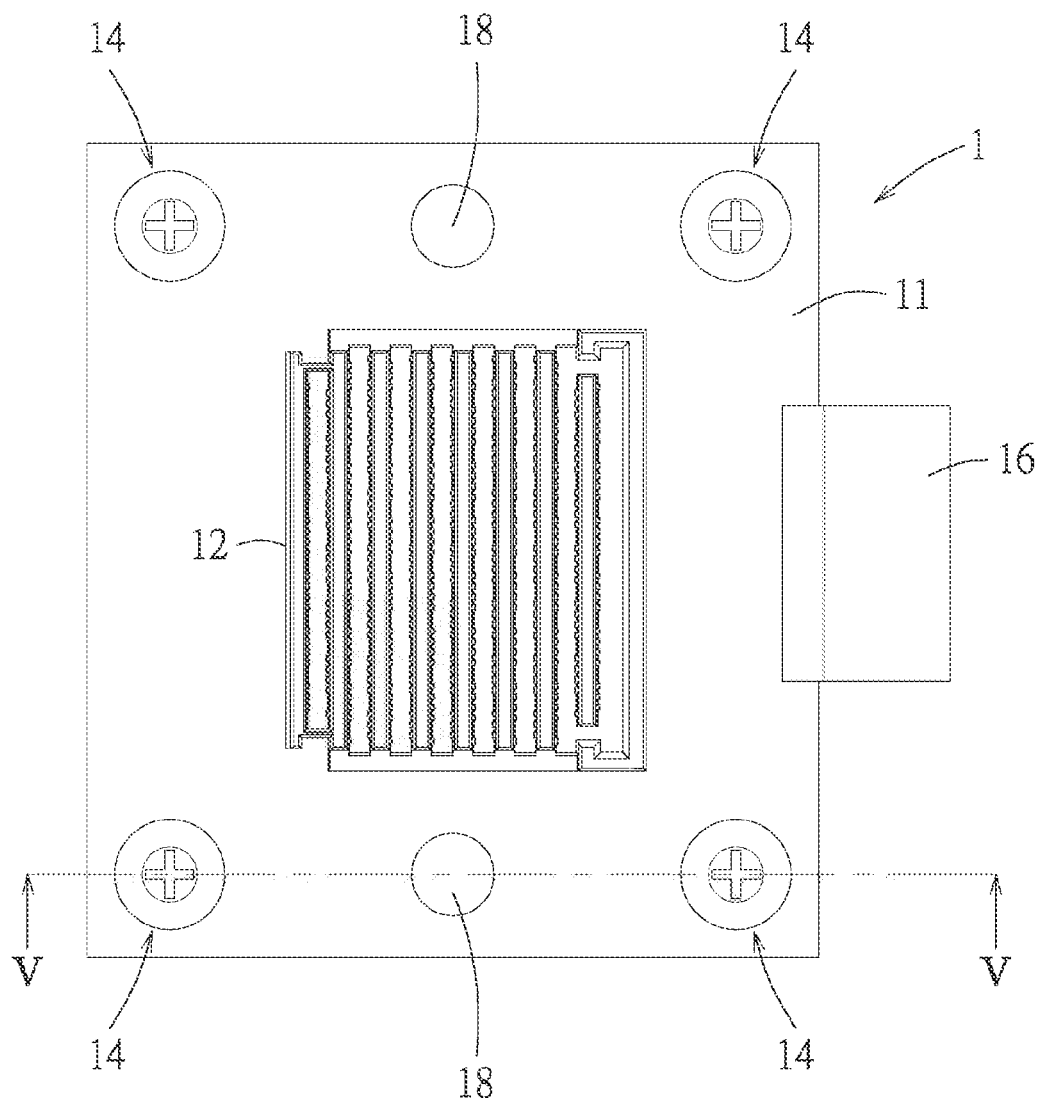
FIG. 4 is a top view of the electrical connection module of the first embodiment.
Figure 5:
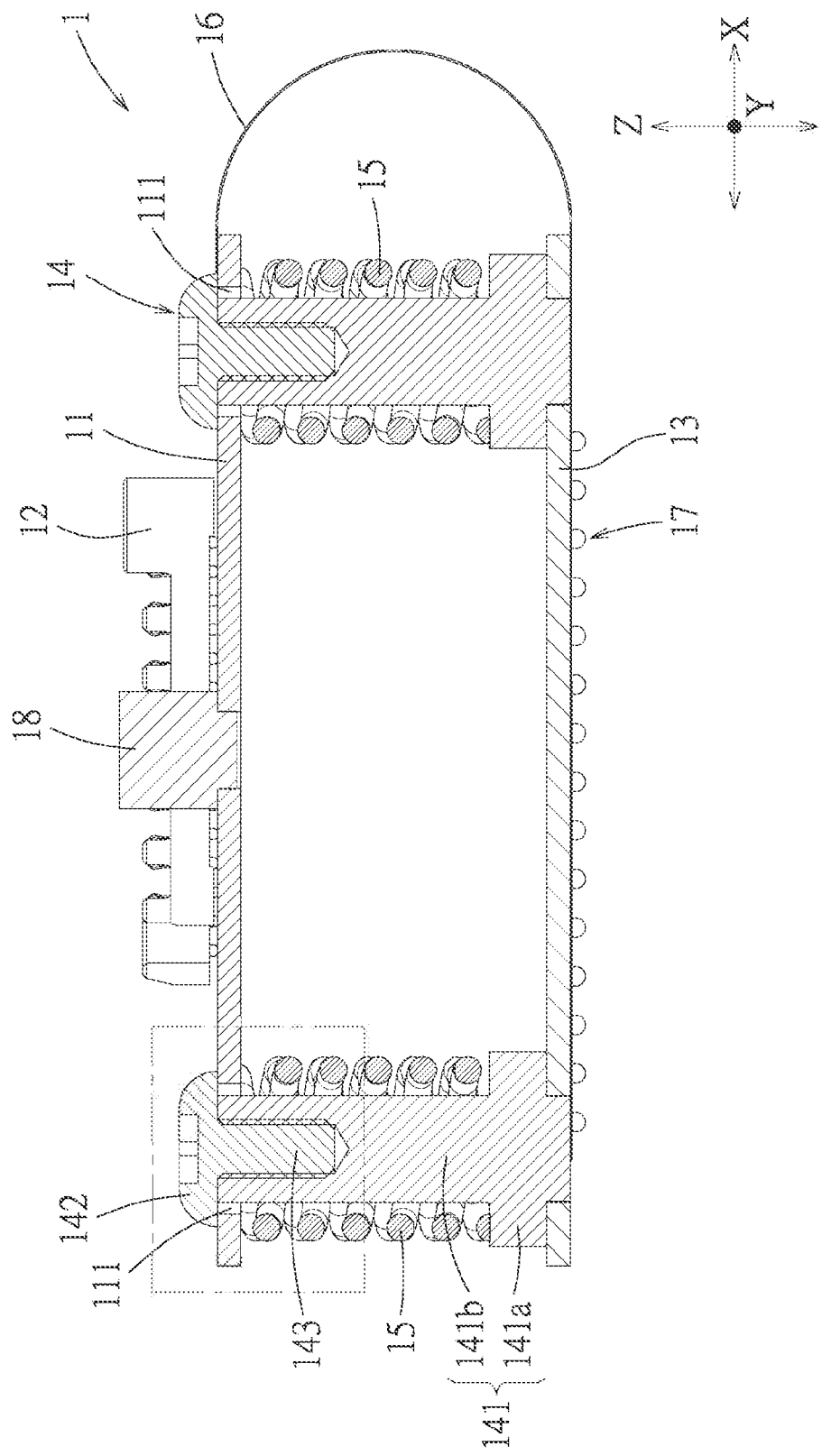
FIG. 5 is a cross-sectional view taken along a line V-V in FIG. 4.
Figure 6:
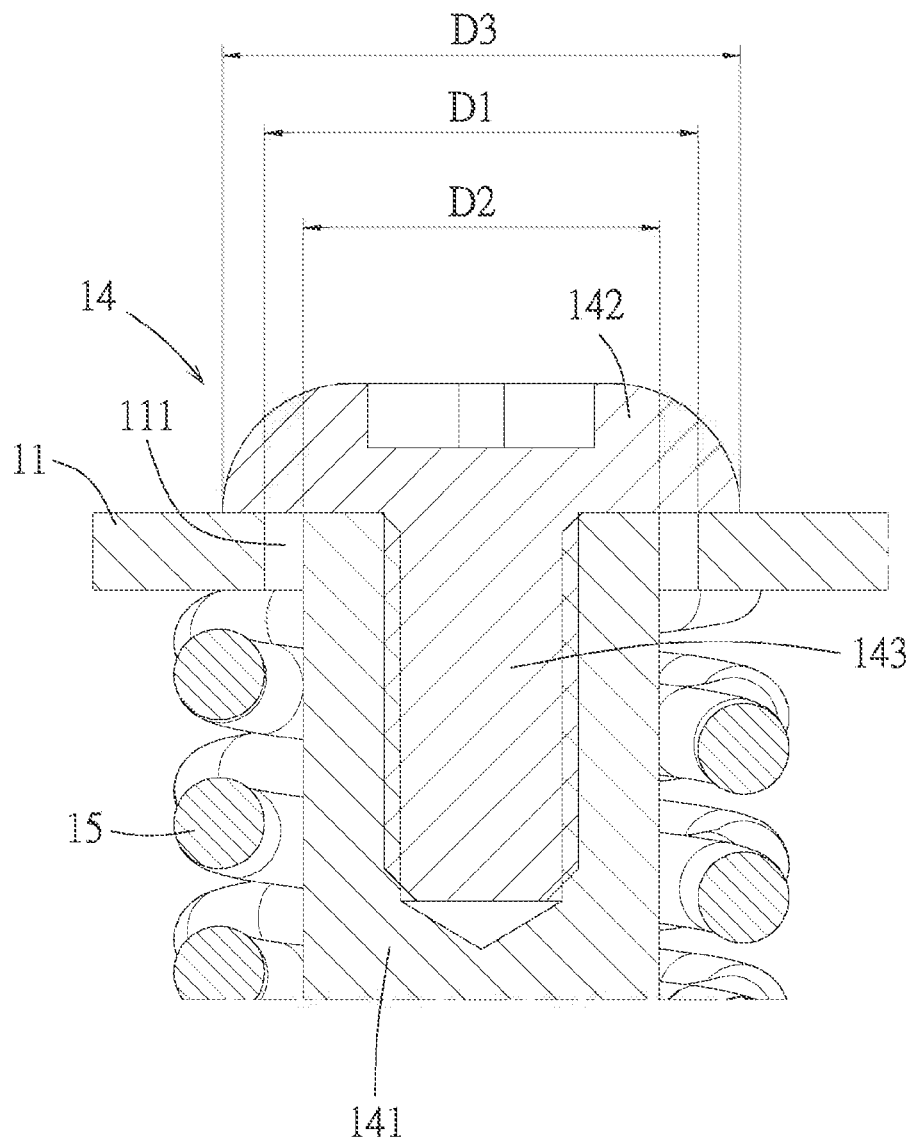
FIG. 6 is an enlarged view of a partial region in FIG. 5.

Referring to FIG. 1 and FIG. 2, a first embodiment of a board-to-board electrical connection device in the present disclosure comprises an electrical connection module 1, an upper circuit board 2, a first complementary connector 3 provided to the upper circuit board 2 and a lower circuit board 4.

The electrical connection module 1 comprises an upper plate 11, a first connector 12, a lower plate 13, a plurality of supporting guide assemblies 14, a plurality of elastic members 15, a flexible circuit board 16, an electrical connecting unit 17 and a plurality of upper stopping blocks 18. The first connector 12 is provided to the upper plate 11, so as to be mated with the first complementary connector 3 in the embodiment, the first connector 12 has the same structure as the first complementary connector 3, specifically is a Mezzanine connector. The plurality of supporting guide assemblies 14 connect the upper plate 11 and the lower plate 13 to allow the lower plate 13 to be spaced apart from the upper plate 11 and positioned below the upper plate 11 and allow that the upper plate 11 can move relative to the lower plate 13 in a plane direction (that is a X-Y plane) of a plate surface thereof and an up-down direction (that is a Z-axis direction). The plurality of elastic members 15 are respectively sheathed onto the plurality of supporting guide assemblies 14 and between the upper plate 11 and the lower plate 13 to provide elastic supporting forces for the upper plate 11. In the first embodiment, the plurality of elastic members 15 are springs, but in a varied embodiment, the plurality of elastic members 15 can also for example cylindrical elastomers. The flexible circuit board 16 has an upper connecting portion 161 connected to the upper plate 11 and a lower connecting portion 162 connected to the lower plate 13. In the first embodiment, an upper surface of the upper plate 11 is provided with a conductive trace (not shown in figures), the first connector 12 and the upper connecting portion 161 of the flexible circuit board 16 are mechanically and electrically connected with the conductive trace, the first connector 12 the flexible circuit board 16 are electrically connected via the conductive trace. Moreover, in the first embodiment, the lower connecting portion 162 of the flexible circuit board 16 is provided to a lower surface of the lower plate 13, the electrical connecting unit 17 consists of a plurality of soldering members 171 (such as soldering balls), the plurality of soldering members 171 are mounted in the lower connecting portion 162 to be electrically connected with the flexible circuit board 16. Further referring to FIG. 8, the electrical connecting unit 17 is positioned to the lower plate 13 so as to be electrically connected with the lower circuit board 4. By that the flexible circuit board 16 and the lower circuit board 4 are electrically connected via the electrical connecting unit 17 and the first complementary connector 3 the first connector 12 are mated with each other, the upper circuit board 2 and the lower circuit board 4 are electrically connected. The plurality of upper stopping blocks 18 are provided to the upper plate 11 to limit an mating depth between the first connector 12 and the first complementary connector 3, and that is limit an spacing distance between the upper circuit board 2 and the upper plate 11, to prevent the first connector 12 from being pressed excessively when the first connector 12 and the first complementary connector 3 are mated with each other.

Figure 7:
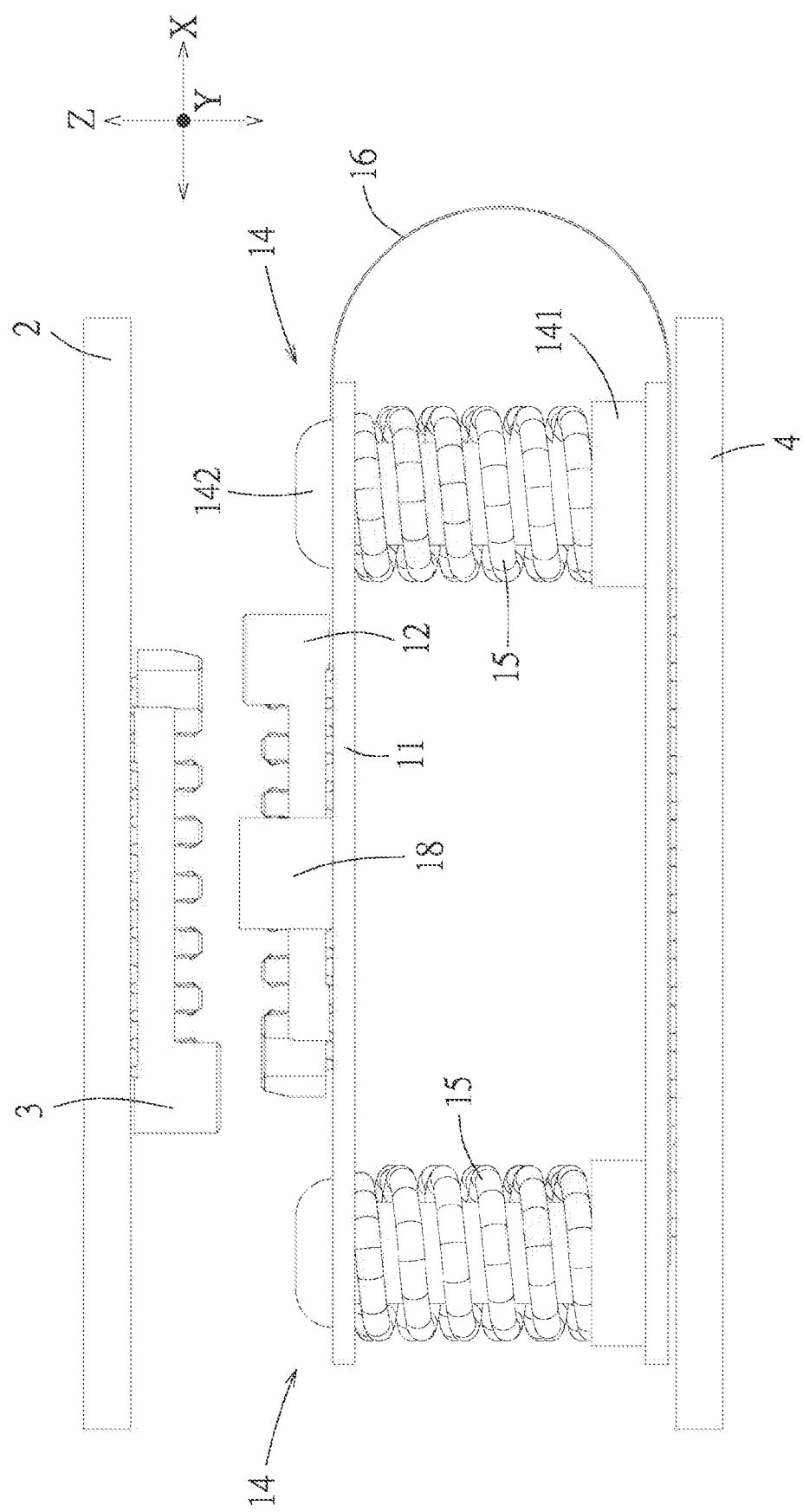
FIG. 7 is an exploded side view illustrating a state before a first connector and a first complementary connector of the first embodiment are mated with each other.
Figure 8:
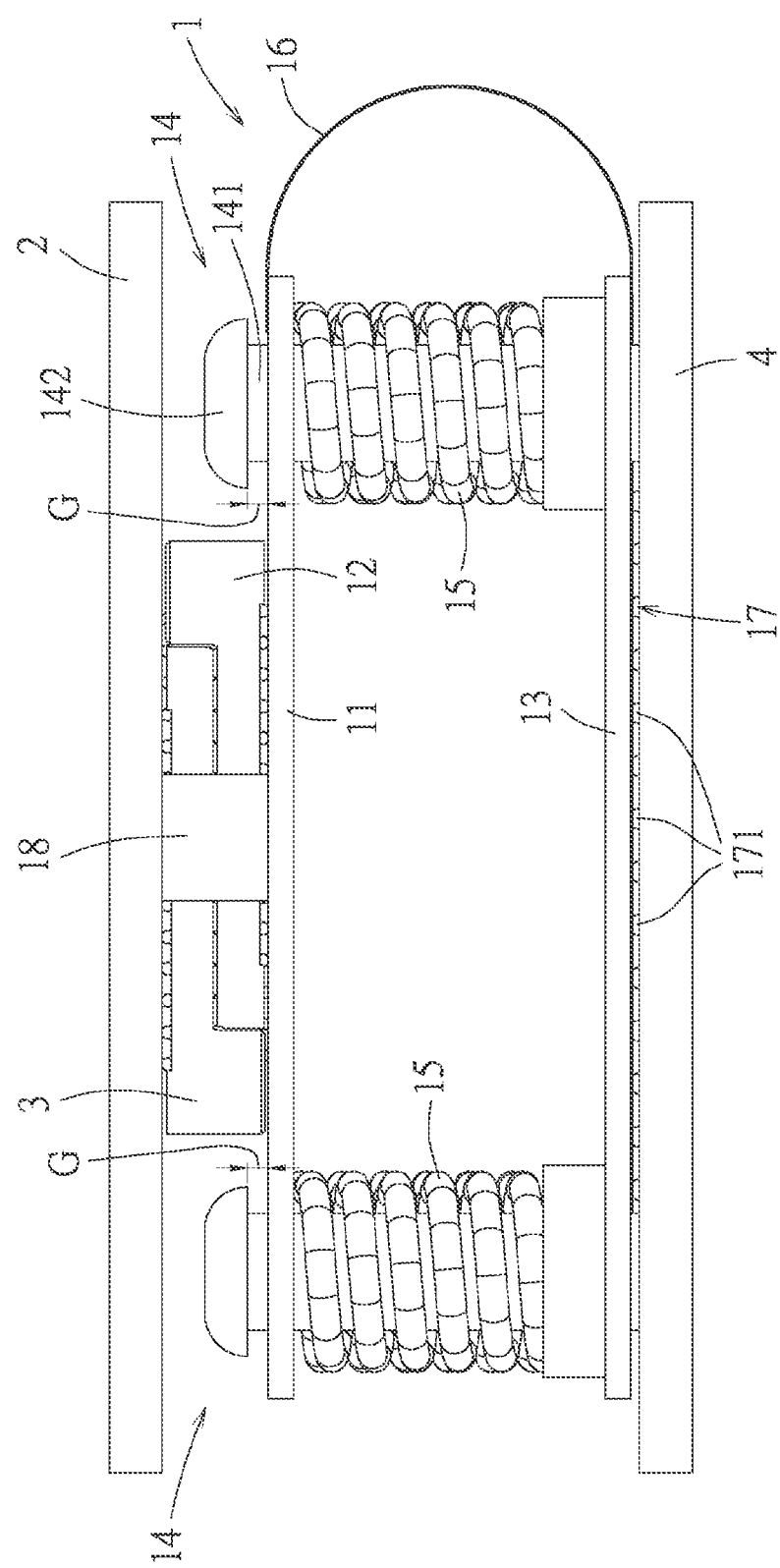
FIG. 8 is a side view illustrating a mating state of the first connector with the first complementary connector of the first embodiment.

Referring to FIG. 3 to FIG. 6, in the first embodiment, the upper plate 11 has a plurality of guiding holes 111 penetrating in the up-down direction, the plurality of guiding holes 111 respectively allow the plurality of supporting guide assemblies 14 to pass through, and a hole diameter D1 of each guiding hole 11 I is larger than an outer diameter D2 of the corresponding supporting guide assembly 14, thereby allowing the upper plate 11 to move in the plane direction (X-Y plane) of the plate surface thereof. Each supporting guide assembly 14 comprises a supporting column 141, an upper limiting member 142 and a lock member 143. A lower end of the supporting column 141 is fixed to the lower plate 13, the supporting column 141 passes through the corresponding guiding hole 111 and the outer diameter D2 of the supporting column 141 is smaller than the hole diameter D1 of the guiding hole 111, and allows the corresponding elastic member 15 to be sheathed thereon. In the first embodiment, the supporting column 141 has a base portion 141a abutting against the lower plate 13 and a column portion 141b whose an outer diameter is smaller than the base portion 141a, the elastic member 15 is sheathed on the column portion 141b and upper and lower ends respectively abut against the upper plate 11 and the base portion 141a, so as to elastically support the upper plate 11 such that the upper plate 11 can move in the up-down direction (the Z-axis direction). The upper limiting member 142 is positioned at an upper end of the supporting column 141 and above the upper plate 11, an outer diameter D3 of the upper limiting member 142 is larger than the hole diameter D1 of the corresponding guiding hole 111 to limit an uppermost position of the upper plate 11 where the upper plate 11 moves upwardly. The lock member 143 connects the supporting column 141 and the upper limiting member 142. In the first embodiment, the upper limiting member 142 and the lock member 143 are an integral formed structure, and may be a screw, but in the varied embodiment, the upper limiting member 142 and the lock member 143 may be structures manufactured separately and then assembled. In a varied embodiment, the upper limiting member 142 may be a C-shaped buckle, and latched to the upper end of the supporting column 141 and positioned above the upper plate 11, Referring to FIG. 7 and FIG. 8, as long as the first complementary connector 3 and the first connector 12 are mated with each other, the upper circuit board 2 and the lower circuit board 4 are electrically connected with each other. During the mating, a relative position between the upper circuit board 2 and the lower circuit board 4 may be deviated, the upper plate 11 may be moved in the plane direction (X-Y plane) of the plate surface to adjust the relative position between the first connector 12 and the first complementary connector 3, such that the first connector 12 is accurately aligned and mated with the first complementary connector 3. As shown in FIG. 8, the upper circuit board 2 and the lower circuit board 4 may be respectively fixed, and the upper circuit board 2 is fixed at a position such that the upper plate 11 compresses the plurality of elastic members 15 and a gap G is formed between the upper plate 11 and the plurality of upper limiting members 142. That is, after the first connector 12 and the first complementary connector 3 are mated with each other, a spacing between the upper plate 11 and the upper circuit board 2 may be maintained by the plurality of upper stopping blocks 18 to prevent the first connector 12 and the first complementary connector 3 from being excessively pressed and be easily damaged. Also, the upper circuit board 2 may be fixed and held at the position where the upper plate 11 is pressed down and the gap G is formed between the upper plate 11 and the plurality of upper limiting members 142, that is, the upper circuit board 2 applies a pressure to the upper plate 11 via the plurality of upper stopping blocks 18, so that the upper plate 11 displaces downwardly and forms the gap G with the plurality of upper limiting members 142 and compresses the plurality of elastic members 15. The sum of the elastic forces applied to the upper plate 11 after the plurality of elastic members 15 are compressed is larger than a mating three between the first connector 12 and the first complementary connector 3, such that under the downward pressure applied by the upper circuit board 2 and the upward force applied by the upper plate 11, it can maintain that the first connector 12 and the first complementary connector 3 are firmly mated with each other. Furthermore, the upper plate 11 can move in a three-dimension direction, and may also absorb forces generated by the external environment, such as movement, vibration or improper external forces. It should be noted that the position of the upper circuit board 2, the gap G and the elastic forces of the plurality of elastic members 15 may be adjusted according to the requirements.

Figure 9:
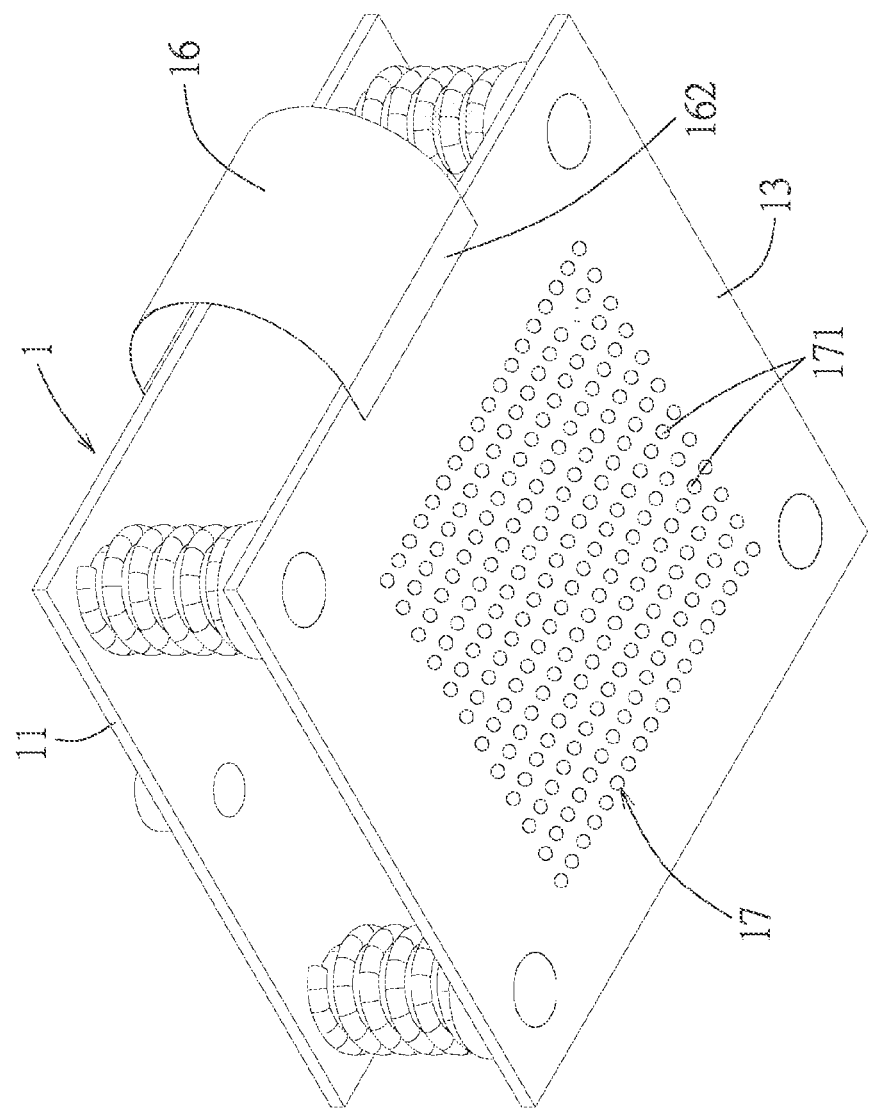
FIG. 9 is a perspective view of the electrical connection module of a second embodiment of the board-to-board electrical connection device in the present disclosure.

Referring to FIG. 9, a second embodiment of the hoard-to-board electrical connection device in the present disclosure is illustrated and different from the first embodiment in that: a lower surface of the lower plate 13 is provided with a conductive trace (not shown in figures), the plurality of soldering members 171 are mounted in the lower surface of the lower plate 13 and electrically connected with the conductive trace of the lower plate 13, the lower connecting portion 162 of the flexible circuit board 16 is mechanically and electrically connected with the conductive trace of the lower plate 13, the electrical connecting unit 17 and the flexible circuit board 16 are electrically connected via the conductive trace of the lower plate 13.

Figure 10:
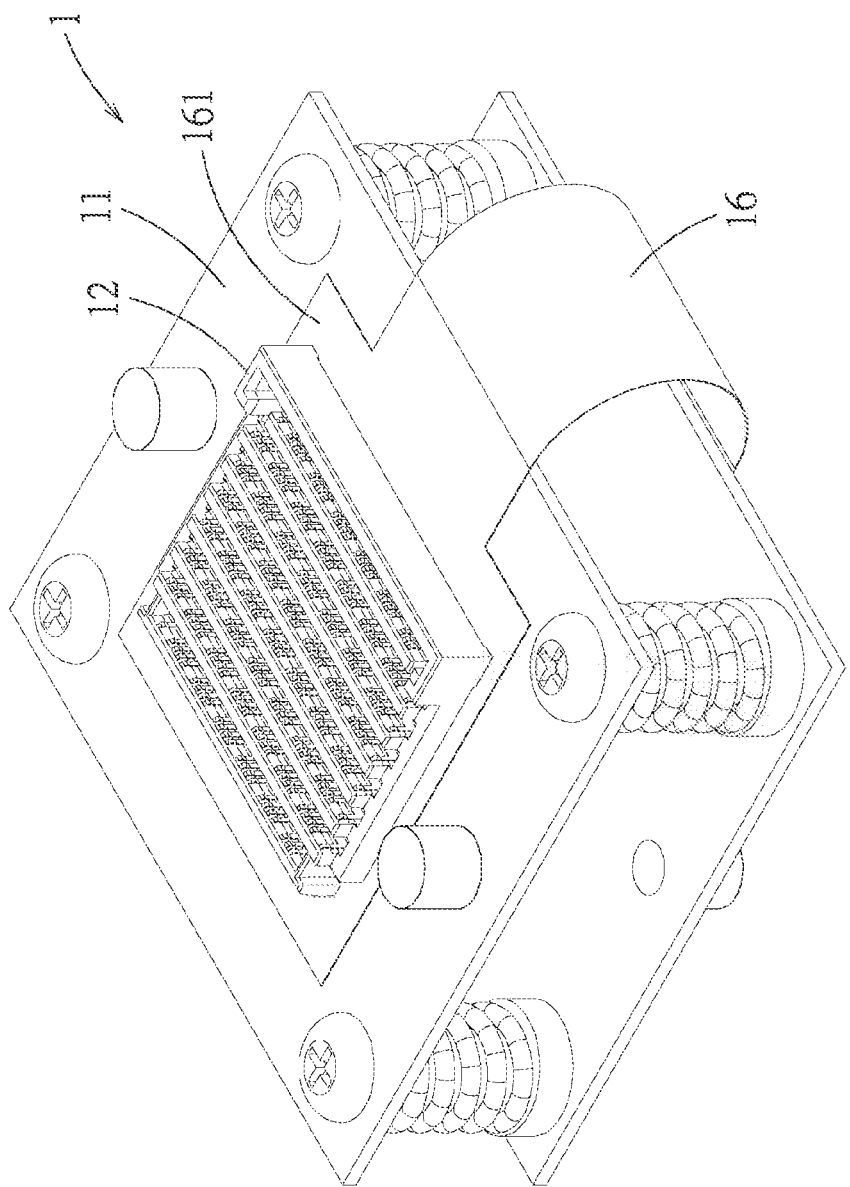
FIG. 10 is a perspective view of the electrical connection module of a third embodiment of the board-to-board electrical connection device in the present disclosure.
Figure 11:
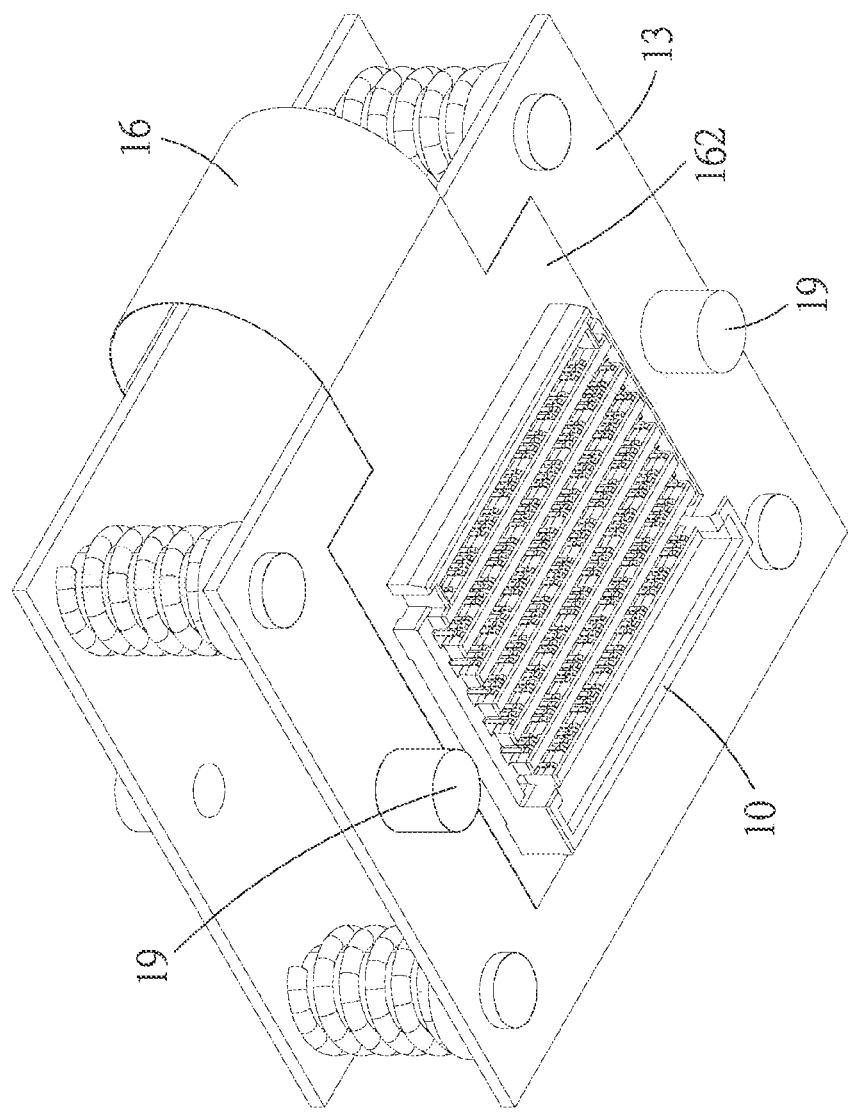
FIG. 11 is a view of FIG. 10 from another angle.
Figure 12:
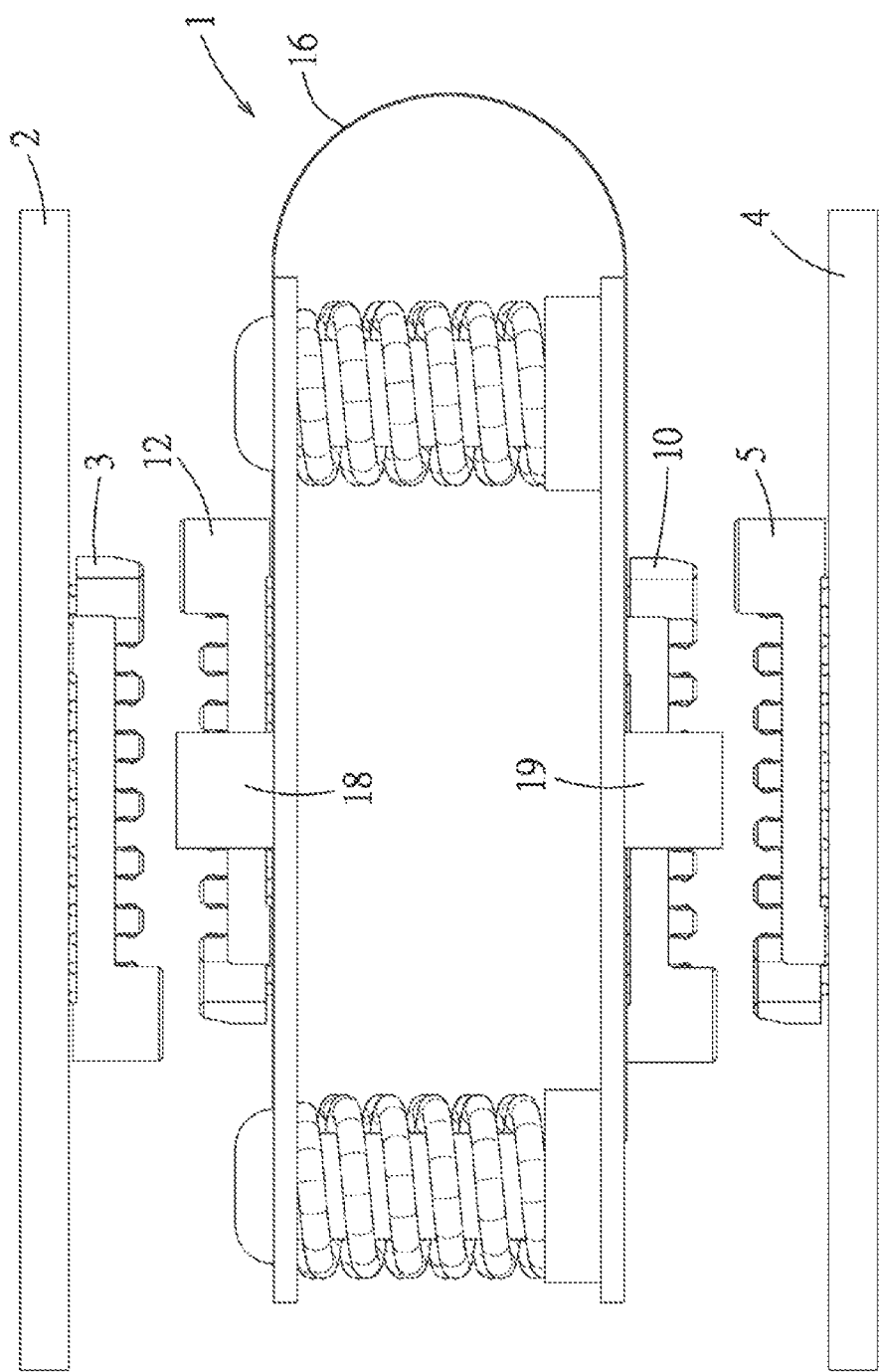
FIG. 12 is an exploded side view illustrating states before the first connector and the first complementary connector of the third embodiment are mated with each other, and before the second connector and the second complementary connector of the third embodiment are mated with each other.

Referring to FIG. 10 to FIG. 12, a third embodiment of the board-to-board electrical connection device in the present disclosure is illustrated and different from the first embodiment in that: the upper connecting portion 161 of the flexible circuit board 16 is provided to an upper surface of the upper plate 11, the first connector 12 is provided to the upper connecting portion 161 and mechanically and electrically connected with the upper connecting portion 161. Furthermore, in the third embodiment, the board-to-board electrical connection device comprises a second complementary connector 5 provided to the lower circuit board 4, the lower connecting portion 162 of the flexible circuit board 16 is provided to the lower surface of the lower plate 13, the electrical connection module 1 further comprises a second connector 10 to be mated with the second complementary connector 5, the second connector 10 is provided to the lower connecting portion 162 and mechanically and electrically connected with the lower connecting portion 162. The electrical connection module 1 further comprises a plurality of lower stopping blocks 19, the plurality of lower stopping blocks 19 are provided to the lower plate 13 to limit a mating depth between the second connector 10 and the second complementary connector 5. That is, when the second connector 10 and the second complementary connector 5 are mated with each other, similarly, it can prevent the second connector 10 and the second complementary connector 5 from being pressed excessively and damaged by means of the plurality of lower stopping blocks 19. In the third embodiment, the first connector 12, the first complementary connector 3, the second connector 10 and the second complementary connector 5 have the same structure, specifically each are a Mezzanine connector. When assembling, the second connector 10 and the second complementary connector 5 are mated with each other firstly, such that the electrical connection module 1 and the lower circuit board 4 are electrically connected, and then the first connector 12 and the first complementary connector 3 are mated with each other, the assembling manner of the first connector 12 and the first complementary connector 3 is same as that of the first embodiment, therefore the detailed description thereof is omitted. It can be understood that, in the varied embodiment, the lower surface of the lower plate 13 may also he provided with the conductive trace, the second connector 10 and the lower connecting portion 162 of the flexible circuit board 16 are mechanically and electrically connected with the conductive trace of the lower plate 13, the second connector 10 and the flexible circuit board 16 are electrically connected via the conductive trace of the lower plate 13, which is similar to the connection manner among the first connector 12, the upper connecting portion 161 and the upper plate 11 in the first embodiment (see FIG. 1).

In conclusion, the upper plate 11 can move in the three-dimension direction and the plurality of elastic members 15 elastically support the upper plate 11 in the up-down direction, which can not only compensate the deviation of the relative position of the upper circuit board 2 and the lower circuit board 4 so that the first connector 12 and the first complementary connector 3 can be accurately aligned with and mated with each other, but also allow that the first connector 12 and the first complementary connector 3 are firmly mated with each other under the elastic threes that the plurality of elastic members 15 are applied to the upper plate 11 and also absorb the forces generated by the external environment, such as movement, vibration or improper external forces. In an embodiment, the flexible circuit board 16 may be arranged with an electronic component thereon for adapter and signal processing, which facilitates the adapter transmission of high-rate signals between the upper circuit board 2 and the lower circuit board 4 and can reduce the number of the electronic component arranged on the two circuit boards.

However, the above described are only the embodiments of the present disclosure, which cannot limit the scope of the implementation of the present disclosure, that is, simple equivalent variations and modifications made according to the scope of the claims and the description content of the present disclosure are still within the scope of the present disclosure.

What is claimed is:

1. An electrical connection module, comprising:
   an upper plate;
   a first connector provided to the upper plate;
   a lower plate spaced apart from the upper plate and positioned below the upper plate;
   a plurality of supporting guide assemblies connecting the upper plate and the lower plate and allowing the upper plate to move relative to the lower plate;
   a plurality of elastic members respectively provided between the upper plate and the lower plate to provide elastic supporting forces for the upper plate;
   an electrical connecting unit provided to the lower plate; and
   a flexible circuit hoard having an upper connecting portion electrically connected to the first connector and a lower connecting portion electrically connected to the electrical connecting unit.

2. The electrical connection module of claim 1, wherein the upper plate has a plurality of guiding holes penetrating in an up-down direction, the plurality of the guiding holes respectively allows the plurality of the supporting guide assemblies to pass through, and a hole diameter of each guiding hole is larger than an outer diameter of the corresponding supporting guide assembly.

3. The electrical connection module of claim 2, wherein each supporting guide assembly comprises a supporting column and an upper limiting member, a lower end of the supporting column is fixed to the lower plate, the supporting column passes through the corresponding guiding hole and the outer diameter of the supporting column is smaller than the hole diameter of the guiding hole, the upper limiting member is positioned at an upper end of the supporting column and above the upper plate, an outer diameter of the upper limiting member is larger than the hole diameter of the corresponding guiding hole to limit an uppermost position of the upper plate where the upper plate moves upwardly, and the plurality of the elastic members are respectively sheathed on the plurality of the supporting columns.

4. The electrical connection module of claim 3, wherein the electrical connection module further comprises a plurality of upper stopping blocks, and the plurality of the upper stopping blocks is provided to the upper plate to limit a mating depth between the first connector and a complementary connector.

5. The electrical connection module of claim 3, wherein each supporting guide assembly further comprises a lock member to connect the supporting column and the upper limiting member.

6. The electrical connection module of claim 1, wherein an upper surface of the upper plate is provided with a conductive trace, the first connector and the upper connecting portion of the flexible circuit board are mechanically and electrically connected with the conductive trace, and the first connector and the flexible circuit board are electrically connected via the conductive trace.

7. The electrical connection module of claim 1, wherein the upper connecting portion of the flexible circuit board is provided to an upper surface of the upper plate, and the first connector is provided to the upper connecting portion and mechanically and electrically connected with the upper connecting portion.

8. The electrical connection module of claim 1, wherein a lower surface of the lower plate is provided with a conductive trace, the electrical connecting unit consists of a plurality of soldering members, the plurality of the soldering members are mounted in the lower surface of the lower plate and electrically connected with the conductive trace of the lower plate, the lower connecting portion of the flexible circuit board is mechanically and electrically connected with the conductive trace of the lower plate, and the electrical connecting unit and the flexible circuit board are electrically connected via the conductive trace of the lower plate.

9. The electrical connection module of claim 1, wherein the lower connecting portion of the flexible circuit board is provided to a lower surface of the lower plate, the electrical connecting unit consists of a plurality of soldering members, and the plurality of the soldering members is mounted in the lower connecting portion to be electrically connected with the flexible circuit board.

10. The electrical connection module of claim 1, wherein the lower connecting portion of the flexible circuit board is provided to a lower surface of the lower plate, the electrical connection module further comprises a second connector, and the second connector is provided to the lower connecting portion and mechanically and electrically connected with the lower connecting portion.

11. The electrical connection module of claim 1, wherein a lower surface of the lower plate is provided with a conductive trace, the electrical connection module further comprises a second connector, the second connector and the lower connecting portion of the flexible circuit hoard are mechanically and electrically connected with the conductive trace of the lower plate, and the second connector and the flexible circuit board are electrically connected via the conductive trace of the lower plate.

12. A board-to-board electrical connection device, comprising:
an upper circuit board;
a first complementary connector provided to the upper circuit board;
a lower circuit board; and
an electrical connection module electrically connecting the upper circuit board and the lower circuit board, and comprising:
an upper plate,
a first connector provided to the upper plate to be mated with the first complementary connector,
a lower plate spaced apart from the upper plate and positioned below the upper plate,
a plurality of supporting guide assemblies connecting the upper plate and the lower plate and allowing the upper plate to move relative to the lower plate,
a plurality of elastic members provided between the upper plate and the lower plate to provide elastic supporting forces for the upper plate,
an electrical connecting unit provided to the lower plate to be electrically connected with the lower circuit hoard, and
a flexible circuit board having an upper connecting portion electrically connected to the first connector and a lower connecting portion electrically connected to the electrical connecting unit.

13. The board-to-board electrical connection device of claim 12, wherein the upper plate has a plurality of guiding holes penetrating in an up-down direction, the plurality of the guiding holes respectively allows the plurality of the supporting guide assemblies to pass through, and a hole diameter of each guiding hole is larger than an outer diameter of the corresponding supporting guide assembly.

14. The board-to-board electrical connection device of claim 13, wherein each supporting guide assembly comprises a supporting column and an upper limiting member, a lower end of the supporting column is fixed to the lower plate, the supporting column passes through the corresponding guiding hole and the outer diameter of the supporting column is smaller than the hole diameter of the guiding hole, the upper limiting member is positioned at an upper end of the supporting column and above the upper plate, an outer diameter of the upper limiting member is larger than the hole diameter of the corresponding guiding hole to limit an uppermost position of the upper plate where the upper plate moves upwardly, and the plurality of the elastic members are respectively sheathed on the plurality of the supporting columns.

15. The board-to-board electrical connection device of claim 14, wherein the electrical connection module further comprises a plurality of upper stopping blocks, and the plurality of the upper stopping blocks is provided to the upper plate to limit an mating depth between the first connector and a complementary connector.

16. The board-to-board electrical connection device of claim 14, wherein each supporting guide assembly further comprises a lock member to connect the supporting column and the upper limiting member.

17. The board-to-board electrical connection device of claim 14, wherein the upper circuit board and the lower circuit board are respectively fixed, and the upper circuit board is fixed at a position such that the upper plate compresses the plurality of the elastic members and a gap is formed between the upper plate and the plurality of the upper limiting members.

18. The board-to-board electrical connection device of claim 12, wherein an upper surface of the upper plate is provided with a conductive trace, the first connector and the upper connecting portion of the flexible circuit board are mechanically and electrically connected with the conductive trace, and the first connector and the flexible circuit board are electrically connected via the conductive trace.

19. The board-to-board electrical connection device of claim 12, wherein the upper connecting portion of the flexible circuit hoard is provided to an upper surface of the upper plate, the first connector is provided to the upper connecting portion and mechanically and electrically connected with the upper connecting portion.

20. The board-to-board electrical connection device of claim 12, wherein a lower surface of the lower plate is provided with a conductive trace, the electrical connecting unit consists of a plurality of soldering members, the plurality of the soldering members are mounted in the lower surface of the lower plate and electrically connected with the conductive trace of the lower plate, the lower connecting portion of the flexible circuit board is mechanically and electrically connected with the conductive trace of the lower plate, the electrical connecting unit and the flexible circuit board are electrically connected via the conductive trace of the lower plate.

21. The board-to-board electrical connection device of claim 12, wherein the lower connecting portion of the flexible circuit hoard is provided to a lower surface of the lower plate, the electrical connecting unit consists of the plurality of soldering members, the plurality of the soldering members is mounted in the lower connecting portion to be electrically connected with the flexible circuit board.

22. The board-to-board electrical connection device of claim 12, wherein the board-to-board electrical connection device further comprises a second complementary connector provided to the lower circuit hoard, the lower connecting portion of the flexible circuit board is provided to a lower surface of the lower plate, the electrical connection module further comprises a second connector to be mated with the second complementary connector, the second connector is provided to the lower connecting portion and mechanically and electrically connected with the lower connecting portion.

23. The board-to-board electrical connection device of claim 12, wherein the board-to-board electrical connection device further comprises a second complementary connector provided to the lower circuit board, a lower surface of the lower plate is provided with a conductive trace, the electrical connection module further comprises a second connector to be mated with the second complementary connector, the second connector and the lower connecting portion of the flexible circuit board are mechanically and electrically connected with the conductive trace of the lower plate, the second connector and the flexible circuit board are electrically connected via the conductive trace of the lower plate.

24. The board-to-board electrical connection device of claim 12, wherein the first connector and the first complementary connector are Mezzanine connectors which have the same structure.

25. The board-to-board electrical connection device of claim 12, wherein a sum of the elastic forces which the plurality of the elastic members apply to the upper plate is larger than a mating force between the first connector and the first complementary connector.

* * * * *